United States Patent
Iucolano et al.

(10) Patent No.: US 10,396,192 B2
(45) Date of Patent: Aug. 27, 2019

(54) HEMT TRANSISTORS WITH IMPROVED ELECTRON MOBILITY

(71) Applicant: STMICROELECTRONICS S.R.L., Agrate Brianza (IT)

(72) Inventors: Ferdinando Iucolano, Gravina di Catania (IT); Andrea Severino, Aci Sant'Antonio (IT); Maria Concetta Nicotra, Catania (IT); Alfonso Patti, Tremestieri Etneo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/020,807

(22) Filed: Jun. 27, 2018

(65) Prior Publication Data
US 2018/0323296 A1    Nov. 8, 2018

Related U.S. Application Data

(60) Continuation of application No. 15/832,680, filed on Dec. 5, 2017, now Pat. No. 10,032,898, which is a
(Continued)

(30) Foreign Application Priority Data

Nov. 12, 2015   (IT) .................. 102015000072114

(51) Int. Cl.
*H01L 29/778*   (2006.01)
*H01L 21/02*    (2006.01)
(Continued)

(52) U.S. Cl.
CPC ...... *H01L 29/7784* (2013.01); *H01L 21/0254* (2013.01); *H01L 21/0262* (2013.01);
(Continued)

(58) Field of Classification Search
CPC ............ H01L 29/7784; H01L 21/0254; H01L 21/0262; H01L 21/28264; H01L 29/2003;
(Continued)

(56) References Cited

U.S. PATENT DOCUMENTS

| 7,985,986 B2 | 7/2011 | Heikman et al. |
| 8,309,987 B2 | 11/2012 | Derluyn et al. |

(Continued)

FOREIGN PATENT DOCUMENTS

| JP | 2008-98455 A | 4/2008 |
| JP | 2008112868 A | 5/2008 |
| JP | 2013-118343 A | 6/2013 |

OTHER PUBLICATIONS

Cai, Y. et al., "High-Performance Enhancement-Mode AlGaN/GaN HEMTs Using Fluoride-Based Plasma Treatment," IEEE Electron Device Letters 26(7):435-437, Jul. 2005.
(Continued)

*Primary Examiner* — Scott B Geyer
(74) *Attorney, Agent, or Firm* — Seed IP Law Group LLP

(57) ABSTRACT

A method for manufacturing a HEMT transistor comprising the steps of: providing a wafer comprising a semiconductor body including a heterojunction structure formed by semiconductor materials that include elements of Groups III-V of the Periodic Table, and a dielectric layer on the semiconductor body; etching selective portions of the wafer, thus exposing a portion of the heterojunction structure; forming an interface layer by a surface reconstruction process, of a semiconductor compound formed by elements of Groups III-V of the Periodic Table, in the exposed portion of the heterojunction structure; and forming a gate electrode, including a gate dielectric and a gate conductive region, on said interface layer.

19 Claims, 7 Drawing Sheets

Related U.S. Application Data division of application No. 15/156,740, filed on May 17, 2016, now Pat. No. 9,882,040.

(51) Int. Cl.
| | | |
|---|---|---|
| *H01L 29/417* | (2006.01) | |
| *H01L 29/423* | (2006.01) | |
| *H01L 29/66* | (2006.01) | |
| *H01L 29/20* | (2006.01) | |
| *H01L 21/28* | (2006.01) | |
| *H01L 29/205* | (2006.01) | |

(52) U.S. Cl.
CPC .... *H01L 21/28264* (2013.01); *H01L 29/2003* (2013.01); *H01L 29/205* (2013.01); *H01L 29/41766* (2013.01); *H01L 29/4236* (2013.01); *H01L 29/66462* (2013.01); *H01L 29/7783* (2013.01); *H01L 29/7786* (2013.01)

(58) Field of Classification Search
CPC ............. H01L 29/205; H01L 29/66462; H01L 29/7783; H01L 29/7786; H01L 29/41766; H01L 29/4236; H01L 29/0843–29/0891; H01L 29/66636–29/66643; H01L 21/823418–21/823425; H01L 21/823814
See application file for complete search history.

(56) References Cited

U.S. PATENT DOCUMENTS

| | | | |
|---|---|---|---|
| 8,441,035 B2 | 5/2013 | Hikita et al. | |
| 8,653,559 B2 | 2/2014 | Coffion et al. | |
| 9,054,167 B2 | 6/2015 | Saunier | |
| 9,165,851 B2 | 10/2015 | Ozaki et al. | |
| 2008/0093626 A1 | 4/2008 | Kuraguchi | |
| 2009/0008677 A1 | 1/2009 | Kikkawa | |
| 2009/0278197 A1* | 11/2009 | Ohta | H01L 21/28587 257/330 |
| 2010/0025730 A1 | 2/2010 | Heikman et al. | |
| 2011/0147795 A1 | 6/2011 | Rachmady et al. | |
| 2011/0186855 A1 | 8/2011 | Ramdani | |
| 2011/0272708 A1 | 11/2011 | Yoshioka et al. | |
| 2012/0205662 A1 | 8/2012 | Nakamura et al. | |
| 2012/0205663 A1 | 8/2012 | Nakamura et al. | |
| 2013/0026495 A1 | 1/2013 | Chu et al. | |
| 2013/0105817 A1 | 5/2013 | Saunier | |
| 2013/0240899 A1 | 9/2013 | Yoshioka et al. | |
| 2015/0311329 A1* | 10/2015 | Nakazawa | H01L 29/66462 257/76 |
| 2016/0133738 A1 | 5/2016 | Chang et al. | |
| 2016/0351564 A1 | 12/2016 | Azize et al. | |
| 2017/0148906 A1* | 5/2017 | Iucolano | H01L 29/4236 |

OTHER PUBLICATIONS

Cole, M. W. et al., "Post growth rapid thermal annealing of GaN: The relationship between annealing temperature, GaN crystal quality, and contact-GaN interfacial structure," Appl. Phys. Left. 71(20):3004-3006, Nov. 17, 1997.

Im, K-S. et al., "Normally Off GaN MOSFET Based on AlGaN/GaN Heterostructure With Extremely High 2DEG Density Grown on Silicon Substrate," IEEE Electron Device Letters 31(3):192-194, Mar. 2010.

Im et al., "Recessed-Gate Normally-Off GaN MOSFET Technologies," International Journal of High Speed Electronics and Systems 21(1):1250007-1-1250007-20, 2012.

Kim, K-W. et al., "Effects of TMAH Treatment on Device Performance of Normally Off $Al_2O_3$/GaN MOSFET," IEEE Electron Device Letters 31(10):1376-1378, Oct. 2011.

King, S. W. et al., "Cleaning of AlN and GaN surfaces," Journal of Applied Physics 84(9):5248-5260, Nov. 1, 1998.

Lim, W. et al., "Normally-Off Operation of Recessed-Gate AlGaN/GaN HFETs for High Power Applications," Electrochemical and Solid-State Letters 14(5):H205-H207, 2011.

Nepal, N. et al., "Assessment of GaN Surface Pretreatment for Atomic Layer Deposited High-k Dielectrics," Applied Physics Express 4:055802-1-055802-3, 2011.

Shenai, K. et al., "Optimum Semiconductors for High-Power Electronics," IEEE Transactions on Electron Devices 36(9):1811-1823, 1989.

Tolbert, Leon M. et al., "Wide Bandgap Semiconductors for Utility Applications," IASTED Int. Conf. Power and Energy Systems (PES), Palm Springs, CA, 2003, pp. 317-321.

Tsao, J., "The World of Compound Semiconductors—A Guidebook to the Core Science and Technology", Sandia National Laboratories, Jul. 2004, 191 pages.

Uemoto, Y. et al., "Gate Injection Transistor (GIT)—A Normally-Off AlGaN/GaN Power Transistor Using Conductivity Modulation," IEEE Transactions on Electron Devices 54(12):3393-3399, Dec. 2007.

* cited by examiner

US 10,396,192 B2

HEMT TRANSISTORS WITH IMPROVED ELECTRON MOBILITY

BACKGROUND

Technical Field

The present disclosure relates to a method for manufacturing an electronic device, in particular a high-electron-mobility transistor (HEMT), and to the electronic device thus obtained.

Description of the Related Art

Known to the art are HEMTs with a heterostructure, made in particular of gallium nitride (GaN) and gallium and aluminum nitride (AlGaN). For instance, HEMT devices are appreciated for use as power switches thanks to their high breakdown threshold. Furthermore, the high current density in the conductive channel of the HEMT enables a low ON-state resistance ($R_{ON}$) of the conductive channel to be obtained.

To favor use of HEMTs in high-power applications, HEMTs with normally off channel have been introduced. HEMT devices with recessed-gate terminal have proven particularly advantageous for use as transistors with normally off channel. A device of this type is, for example, known from Wantae Lim et al., "Normally-Off Operation of Recessed-Gate AlGaN/GaN HFETs for High Power Applications", Electrochem. Solid-State Lett. 2011, volume 14, issue 5, H205-H207.

This HEMT has a gate trench that extends in depth in the heterostructure until it reaches the GaN layer. Extending in said trench is the gate metallization, which is separated from the AlGaN/GaN layers that form the heterostructure by a gate dielectric layer. Formation of the gate trench is obtained by known steps of chemical etching and generates morphological defectiveness of various nature, such as for example even extensive surface corrugations or in general damage generated by the etching process (such as, for example, depressions or protuberances).

An important step in the manufacture of HEMTs with recessed gate terminal lies precisely in the minimization of defectiveness at the interface between the GaN semiconductor layer belonging to the heterostructure and the gate dielectric. The presence of such defectiveness, in fact, is the cause of a wide range of problems, amongst which a reduced threshold voltage, a high noise signal, a high ON-state resistance, and in general a reduction of the levels of performance of the device.

In order to reduce the aforementioned interface defectiveness, the relevant literature reports numerous techniques, amongst which cleaning of the trench prior to the step of deposition of the dielectric and of the gate metallization.

Cleaning of the trench may be carried out using a Piranha solution and hydrofluoric acid (HF), as taught by Neeraj Nepal in "Assessment of GaN Surface Pretreatment for Atomic Layer Deposited High-k Dielectrics", Applied Physics Express, Volume 4, Number 5, 2011.

Another method of a known type envisages use of TMAH (tetramethylammonium hydroxide), as suggested by Ki-Won Kim et al., "Effects of TMAH Treatment on Device Performance of Normally Off Al2O3/GaN MOSFET", IEEE Electron Device Letters, Volume 32, Issue 10, October 2011, with the aim of reducing the roughness of the exposed surface in the trench and eliminating the surface damage deriving from an aggressive plasma etch during formation of the trench itself.

Even though the methods referred to above enable an improvement of the levels of performance to be obtained, the field-effect mobility is relatively low (<60 $cm^2/Vs$).

Other methods proposed envisage a thermal treatment at high temperature (600-900° C.) of the GaN surface exposed through the trench in order to limit absorption of contaminants, such as oxygen and carbon. An excellent result, in terms of absence of absorption, is obtained at temperatures of 950° C. However, a thermal treatment at this temperature may cause serious damage to the exposed GaN surface.

BRIEF SUMMARY

According to the present disclosure, a method for manufacturing an HEMT, and an HEMT are thus provided.

At least some embodiments of the present disclosure are directed to an HEMT that includes:

a semiconductor body including a heterojunction structure formed by semiconductor materials that include elements of Groups III-V of the Periodic Table;

a dielectric layer on the semiconductor body;

a gate electrode, including a gate dielectric, and a gate conductive region, which presents a recessed portion that extends in the semiconductor body at the heterojunction structure; and an interface layer, of a semiconductor compound formed by elements of Groups III-V of the Periodic Table, which surrounds the recessed portion of the gate electrode so that the gate electrode is separated from the semiconductor body by the interface layer.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
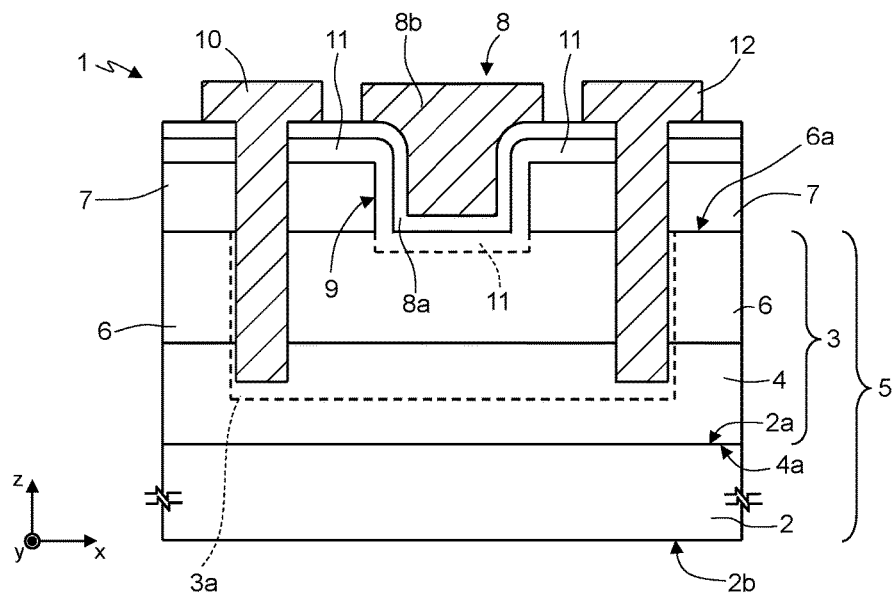
FIG. 1 shows an HEMT of a normally on type, according to one embodiment of the present disclosure.

FIG. 1 shows, in a triaxial system of orthogonal axes X, Y, Z, an HEMT device 1 of a normally-on type, based upon gallium nitride, including: a substrate 2, made, for example, of silicon, or silicon carbide (SiC) or sapphire ($Al_2O_3$); a channel layer 4, of intrinsic gallium nitride (GaN), which extends over the substrate 2 and has a thickness comprised between approximately 10 nm and 10 μm, for example, approximately 1 μm (but it is in any case possible to have thicknesses of 100 μm or higher); a barrier layer 6, of intrinsic aluminum and gallium nitride (AlGaN) or, more in general, compounds based upon ternary or quaternary alloys of gallium nitride, such as $Al_xGa_{1-x}N$, AlInGaN, and $In_xGa_{1-x}N$, which extends over the channel layer 4 and has a thickness comprised between approximately 5 nm and 400 nm, for example, approximately 15 nm; an insulation layer 7, of dielectric material such as silicon nitride ($Si_3N_4$) or silicon oxide ($SiO_2$), which extends on a top side 6a of the barrier layer 6; and a gate region 8, which extends in the semiconductor body 3 between the source region 10 and the drain region 12.

The channel layer 4 and the barrier layer 6 form a heterostructure 3. The substrate 2, the channel layer 4, and the barrier layer 6 are defined in what follows, as a whole, by the term "semiconductor body 5". The heterostructure 3 thus extends between an underside 4a of the channel layer 4, which forms part of the interface with the underlying substrate 2, and a top side 6a of the barrier layer 6. The semiconductor body 5 houses an active region 3a, which constitutes the active part of the HEMT device.

The gate region 8 is separated laterally (i.e., along X) from the source region 10 and drain region 12 by respective portions of the insulation layer 7. The gate region 8 is of a recessed type, i.e., it extends in depth through the insulation layer 7 until it reaches the barrier layer 6. In other words, the gate region 8 is formed in a trench 9 dug through the insulation layer 7. Optionally, the trench 9 extends through a part of the barrier layer 6 (for example, for a depth of 1-10 nm).

The trench 9 is partially filled by an interface layer 11, of a material such as for example $Al_xGa_{1-x}N$, or, in general, of a semiconductor compound formed by elements belonging to Groups III-V, which in particular contains nitride. The interface layer 11 extends over the bottom and the inner side walls of the trench 9. A gate dielectric layer 8a extends in the trench 9 on the interface layer 11, facing the bottom and side walls of the trench 9. A gate metallization 8b completes filling of the trench 9 and extends over the gate dielectric layer 8a. The gate dielectric layer 8a and the gate metallization 8b form the gate region of the HEMT device 1.

The interface layer 11 may be alternatively of an intrinsic type or else doped (with N or P doping). Use of a doping of an N type makes it possible to improve the value of ON-state resistance ($R_{ON}$ decreases) at the expense of the threshold voltage ($V_{TH}$), whereas use of a doping of a P type enables improvement of the value of threshold voltage ($V_{TH}$ increases) at the expense of $R_{ON}$. Use of a doping of an intrinsic type is an intermediate solution that enables balancing between $R_{ON}$ and $V_{TH}$.

According to further embodiments (not shown), the semiconductor body 5, as likewise the active region 3a housed thereby, may comprise, if need be, a single layer or a number of layers of GaN, or GaN alloys, appropriately doped or of an intrinsic type.

The source region 10 and drain region 12, of conductive material, for example metal, extend in depth in the semiconductor body 5, right through the barrier layer 6 and partially through the channel layer 4, and terminate in the channel layer 4.

The gate region 8 extends in an area corresponding to the active region 3a. Furthermore, it should be noted that the interface layer 11 extends along the walls of the trench 9, i.e., alongside the gate region 8, between the gate dielectric layer 8a and the insulation layer 7, as well as over the insulation layer 7. Optionally, it is possible to remove, at least partially, the portions of the filling region 11 that extend over the insulation layer 7 and/or between the gate dielectric layer 8a and the insulation layer 7.

Indifferently, the trench 9 may terminate on the surface 6a of the barrier layer 6 or else penetrate in part into the barrier layer 6, even only minimally, for example for a depth comprised between 1 nm and some tens of nanometers.

Figure 2:
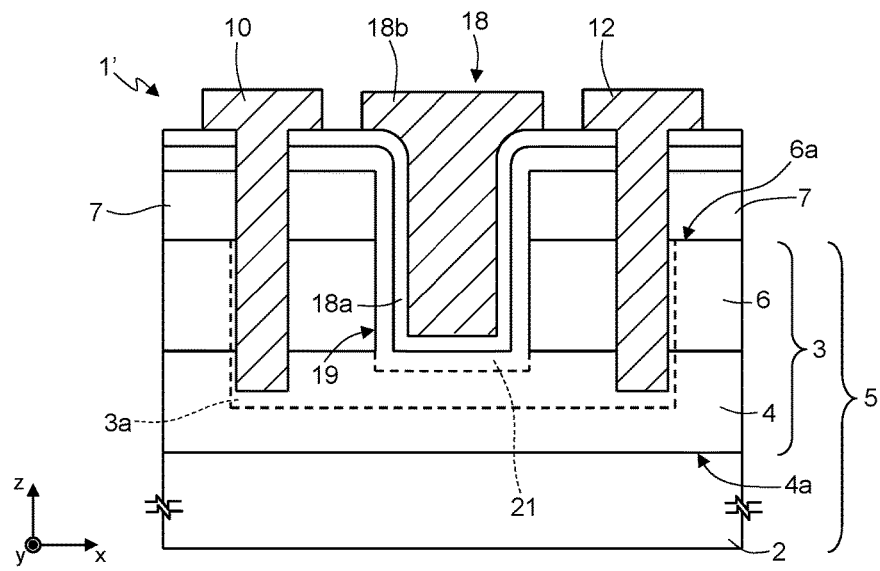
FIG. 2 shows an HEMT of a normally off type, according to a further embodiment of the present disclosure.

FIG. 2 shows, according to a further embodiment of the present disclosure, a HEMT device 1' of the normally off type. Elements of the HEMT device 1' of FIG. 2 and of the HEMT device 1 of FIG. 1 that are in common are designated by the same reference numbers and are not described any further.

The HEMT device 1' of FIG. 2 has a trench 19 that extends in depth, right through the barrier layer 6, until it reaches the channel layer 4. The trench 19 houses a recessed gate region 18.

The bottom and side walls of the trench 19 are coated by an interface layer 21, which fills the trench 19 only partially. The interface layer 21 is of a material such as GaN, AlGaN, or $Al_xGa_{1-x}N$, or of a semiconductor compound formed by elements belonging to Groups III-V, in particular containing nitride. A gate dielectric layer 18a extends over the interface layer 21 and thus faces the bottom and side walls of the trench 19. A gate metallization 18b completes filling of the trench 19 and extends over the gate dielectric layer 18a. The gate dielectric layer 18a and the gate metallization 18b form the gate region of the HEMT device 1'.

The interface layer 21 may be alternatively of an intrinsic type or else doped (with N or P doping). In particular, an interface layer with a doping of a P type (for example, with magnesium atoms) achieves the advantage of increasing the threshold voltage.

The gate region 18 extends over, and vertically aligned in the direction Z to, the active region 3a, and reaches a maximum depth, along Z, less than the maximum depth reached by the source and drain regions 10, 12. Furthermore, the filling region 21 extends along the side walls of the trench 19, i.e., alongside the gate region 18, between the gate dielectric layer 18a and the insulation layer 7, as well as over the insulation layer 7. Optionally, it is possible to remove, at least partially, the portions of the filling region 21 that extend over of the insulation layer 7 and/or between the gate dielectric layer 18a and the insulation layer 7.

Indifferently, the trench 19 may terminate at the surface 4a of the channel layer 4 or else may extend, in part, into the channel layer 4, even only minimally, for example, for a depth ranging between 1 nm and some hundreds of nanometers.

Described in what follows, with reference to FIGS. 3A-3G, are steps for manufacturing the HEMT device 1 of FIG. 1.

Figure 3A:
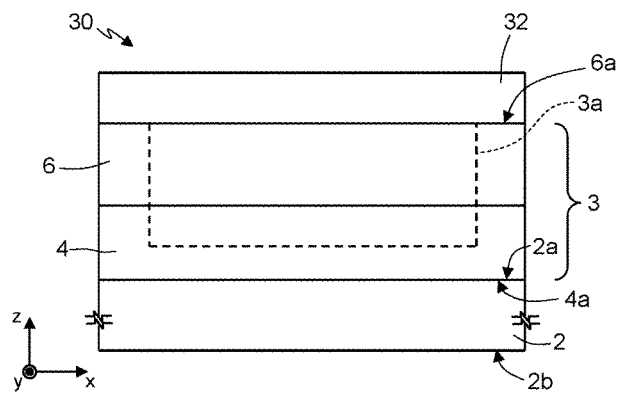
FIGS. 3A-3G show steps for manufacturing the HEMT of FIG. 1.

FIG. 3A shows, in cross-sectional view, a portion of a wafer 30 during a step for manufacturing a HEMT device, according to one embodiment of the present disclosure. Elements of the wafer 30 that are in common with the ones already described with reference to FIG. 1, and shown therein, are designated by the same reference numbers and are not described any further in detail.

In particular (FIG. 3A), the wafer 30 is provided comprising: the substrate 2, made, for example, of silicon (Si) or silicon carbide (SiC) or aluminum oxide ($Al_2O_3$), having a front side 2a and a rear side 2b opposite to one another in a direction Z; the channel layer 4, of gallium nitride (GaN), having its own underside 4a that extends adjacent to and overlying the front side 2a of the substrate 2; and the barrier layer 6, of gallium and aluminum nitride (AlGaN), which extends over the channel layer 4. The barrier layer 6 and the channel layer 4 form the heterostructure 3.

According to the present disclosure, formed on the front side of the barrier layer 6 is a passivation layer, or dielectric layer, 32, of dielectric or insulating material such as silicon nitride (SiN), silicon oxide ($SiO_2$), or some other material. The passivation layer 32 has a thickness comprised between 5 nm and 300 nm, for example 100 nm, and is formed by CVD (chemical vapor deposition) or ALD (atomic-layer deposition) and, at the end of the manufacturing steps, will form the insulation layer 7.

Then (FIG. 3B), the passivation layer 32 is selectively removed, for example by lithographic and etching steps for removing selective portions thereof in the region of the wafer 30 where, in subsequent steps, a gate region of the HEMT device is to be formed (i.e., on a part of the active area 3a).

Figure 3B:
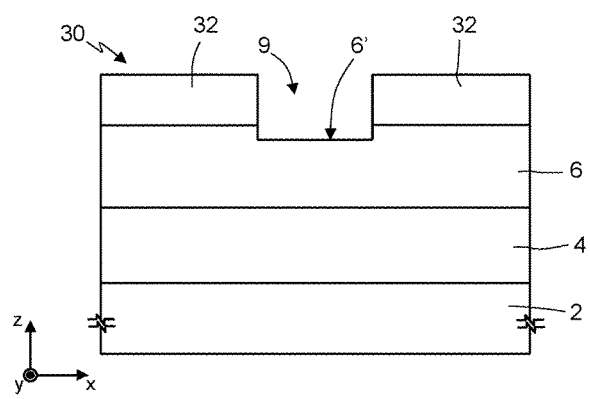
Figure 3C:
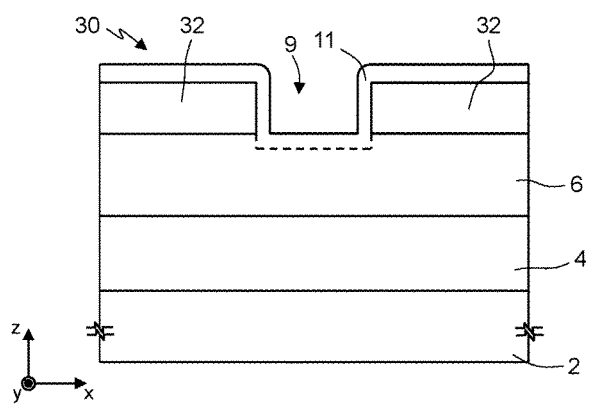
Figure 3D:
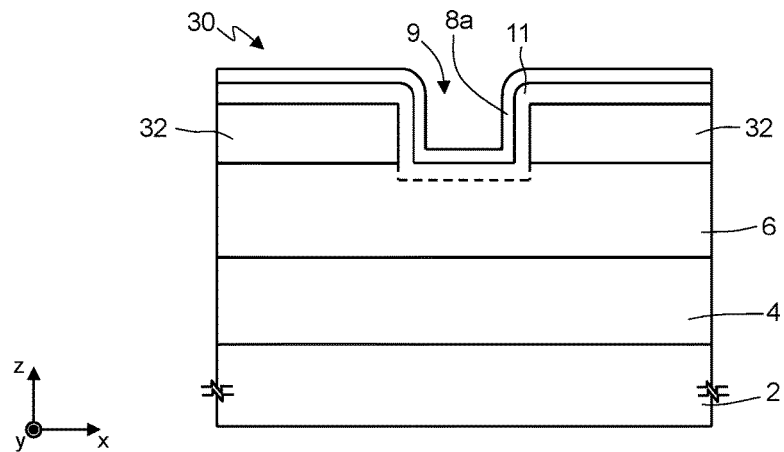
Figure 3E:
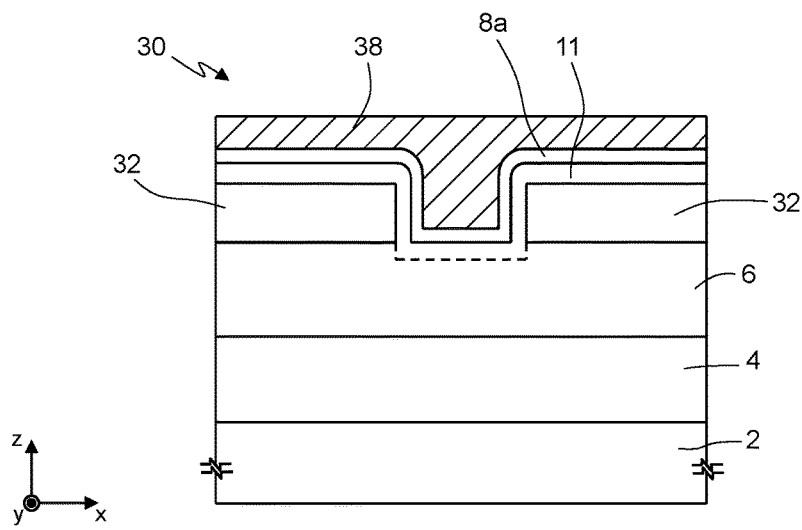
Figure 3F:
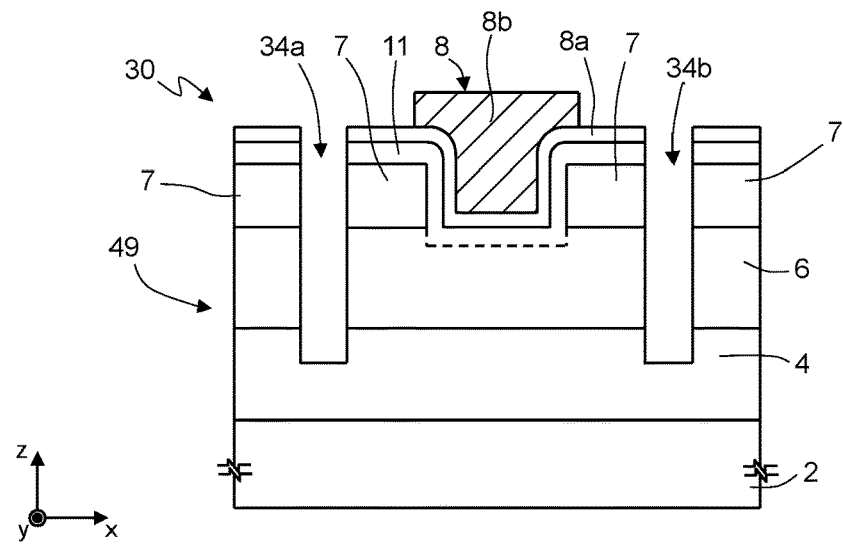
Figure 3G:
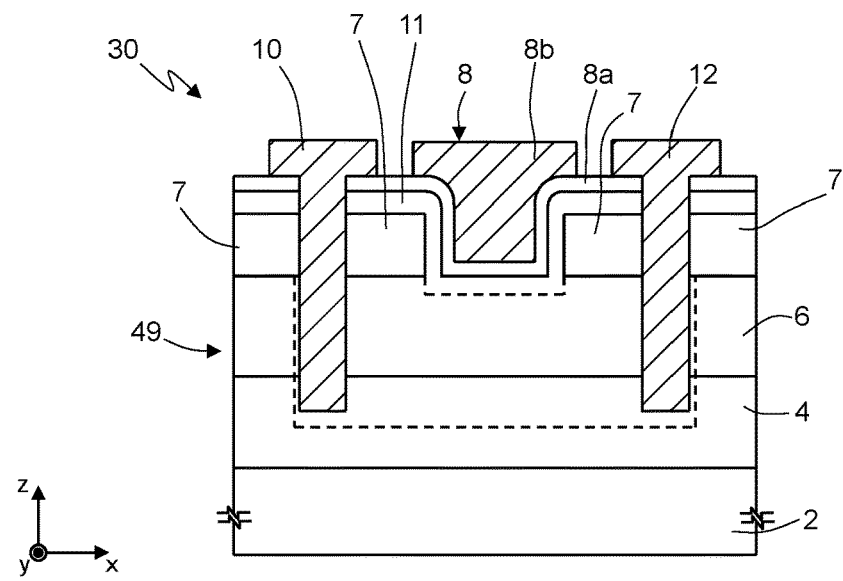

The etching step may stop at the underlying barrier layer 6 or else proceed partially into the barrier layer 6 (the latter solution is shown in FIG. 3B). In either case, a surface portion 6' of the underlying barrier layer 6 is exposed. Etching of the barrier layer 6 is, for example, carried out by dry etching. The portion of the barrier layer 6 removed generates a cavity having a depth comprised, for example, between 0 and 5 nm along Z.

The trench 9 is thus formed, which extends throughout the thickness of the passivation layer 32 and for a portion of the underlying barrier layer 6.

Next (FIG. 3C), a step of deposition, or growth, of the interface layer 11, in particular of gallium and aluminum nitride ($Al_xGa_{1-x}N$), is carried out at the surface portion 6' of the barrier layer 6. In general, it is possible to grow a layer of a semiconductor compound formed by elements belonging to Groups III-V of the Periodic Table via the use of organometallic precursors that contain atoms of aluminum, such as trimethyl aluminum (TMAl) and similar compounds, and gallium, such as trimethyl gallium (TMGa), triethyl gallium (TEGa) and similar compounds, more in general, any compound belonging to the family of compounds (metal alkyls) containing gallium (Ga), aluminum (Al), and/or dopants of gallium nitride and gallium and aluminum nitride. These are made to react at temperatures higher than 500° C. but lower than 1000° C. with gaseous compounds such as ammonia ($NH_3$) with gas carriers constituted by molecular hydrogen ($H_2$) and/or nitrogen ($N_2$) within CVD reactors.

This step is carried out in a CVD, in particular MOCVD (metal-organic chemical vapor deposition), reactor in an environment that has, as organometallic precursor, trimethyl gallium (TMGa) and/or trimethyl aluminum (TMAl), as gaseous compound containing nitrogen, ammonia ($NH_3$), and, as gas carrier, molecular nitrogen ($N_2$) or else hydrogen ($H_2$). The temperature in the reactor is comprised between approximately 500° C. and 1000° C., preferably between 650° C. and 850° C., in particular between 700° C. and 800° C. These temperature ranges enable a good quality of the interface layer 11 to be obtained, at the same time, without any damage to the layers of the device already formed.

The reaction process is carried out in the way described hereinafter. The temperature is brought, in an initial step of the growth process, to the desired operating value (for example, 750° C.). During the rise in temperature, nitrogen gas ($N_2$) is introduced into the reactor, in the absence of hydrogen, in order to preserve the surface 6' from phenomena of desorption or release of N and/or Ga and/or Al atoms from the surface by transition from the solid phase to the gaseous phase that would occur in an environment that presents hydrogen at the aforesaid operating temperatures. Together with nitrogen, ammonia ($NH_3$) is optionally introduced into the reaction chamber, in a ratio with nitrogen such as $5<N_2/NH_3<15$, preferably $8<N_2/NH_3<12$, for example $N_2/NH_3=10$.

A precursor containing aluminum (Al), for example, TMAl, and a precursor containing gallium (Ga), for example TMGa, are introduced into the reaction chamber when the desired working temperature is reached. The ratio between the two species of precursors (Ga and Al) is preferably in favor of gallium in the case of deposition of AlGaN layers. Organometallic precursors, such as for example other metal alkyls containing Ga and/or Al, may further be introduced into the reaction chamber after the working temperature has been reached. The flowrate of introduction of said organometallic precursors is chosen lower than 100 μmol/min, preferably lower than 75 μmol/min, in particular between 35 and 65 μmol/min.

The growth of the interface layer 11 is carried out following the protocol given above until a layer is obtained having a thickness of less than 10 nm, preferably less than 5 nm, for example between 1 and 3 nm.

Then (FIG. 3D), formed, for instance by deposition, is the gate dielectric layer 8a, made, for example, of aluminum nitride (AlN), silicon nitride (SiN), aluminum oxide ($Al_2O_3$), silicon oxide ($SiO_2$), Hafnium Oxide ($HfO_2$), or other dielectrics. The gate dielectric layer 8a has a thickness chosen between 1 and 50 nm, for example 20 nm.

Then (FIG. 3E), a step of deposition of conductive material on the wafer 30 is carried out to form a conductive layer 38 on the gate dielectric layer 8a, in particular in order to fill the trench 9. For instance, the conductive layer 38 is of metal material, such as tantalum (Ta), tantalum nitride (TaN), titanium nitride (TiN), palladium (Pd), tungsten (W), tungsten silicide ($WSi_2$), titanium aluminum (Ti/Al), nickel gold (Ni/Au), etc.

The conductive layer 38 is then selectively removed by lithographic and etching steps in themselves known for eliminating the conductive layer 38 from the wafer 30 except for the portion thereof that extends in the trench 9 to form the gate metallization 8b. The gate metallization 8b and the gate dielectric 8a form, as a whole, the recessed gate region 8 of the HEMT device of FIG. 1. Next (FIG. 3F), one or more further steps of masked etching of the gate dielectric 8a, of the passivation layer 32, of the interface layer 11, of the barrier layer 6, and of the channel layer 4 are carried out to remove selective portions thereof that extend in regions of the wafer 30 where the source and gate regions 10, 12 of the HEMT device 1 are to be formed. Removal of portions of the passivation layer 32 leads to formation of the insulation layer 7 as illustrated in FIG. 1.

In particular, openings 34a and 34b are formed on opposite sides, along X, of the gate region 8, and at a distance from the gate region 8.

Then (FIG. 3G), a step of formation of ohmic contacts is carried out to obtain the source and drain regions 10, 12, by depositing conductive material, in particular metal such as titanium (Ti) or aluminum (Al), or alloys or compounds thereof, by sputtering or evaporation, on the wafer 30 and in particular inside the openings 34a, 34b. Then a subsequent etching step of the metal layer thus deposited is carried out to remove said metal layer from the wafer 30 except for the metal portions that extend inside the openings 34a and 34b, thus forming in said openings 34a and 34b the source region 10 and drain region 12, respectively.

Then, an RTA (rapid thermal annealing) step, for example at a temperature comprised between approximately 500° C. and 900° C. for a time of from 20 s to 5 min, enables formation of electrode ohmic contacts of the source region 10 and drain region 12 with the underlying region (which presents the two-dimensional electron gas—2DEG).

The HEMT device 1 shown in FIG. 1 is thus formed.

FIGS. 4A-4D show steps for manufacturing a HEMT device according to an embodiment of the present disclosure, alternative to that of FIGS. 3A-3G, in particular for manufacturing the HEMT device 1' of FIG. 2.

Figure 4A:
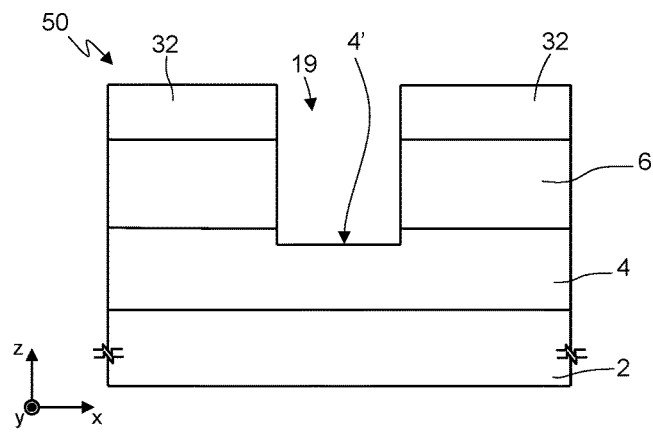
FIGS. 4A-4F show steps for manufacturing the HEMT of FIG. 2.
Figure 4B:
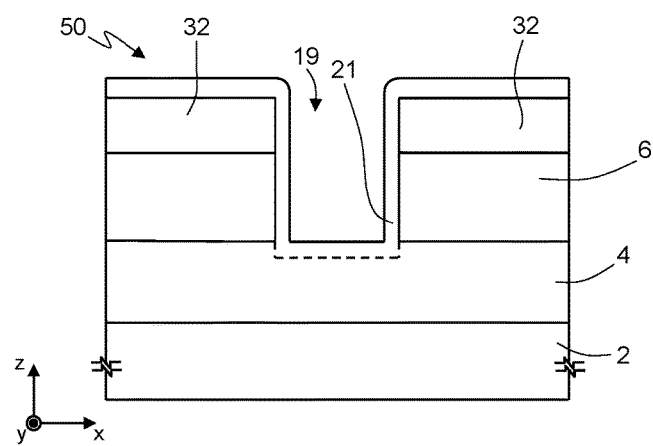
Figure 4C:
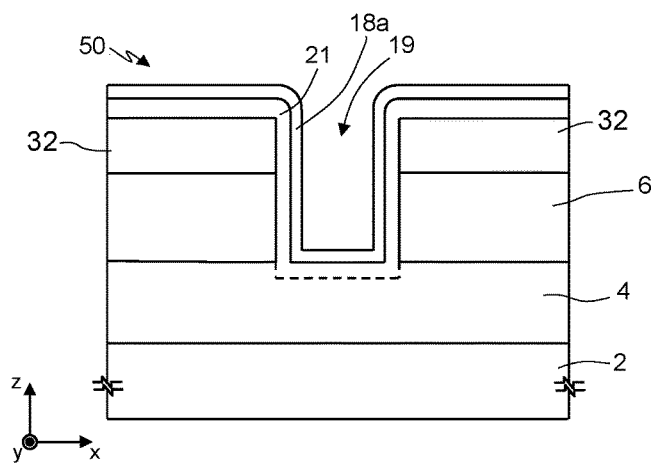
Figure 4D:
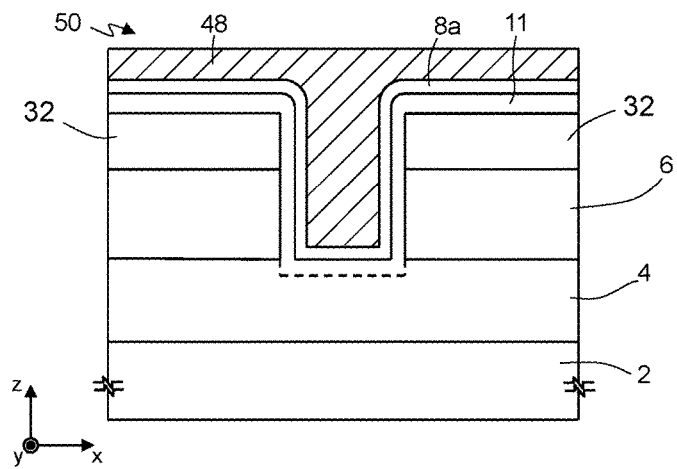

In greater detail (FIG. 4A), after a wafer 50 has been processed according to what has already been described with reference to FIG. 3A (and thus not described again here), etching of the passivation layer 32 and of the barrier layer 6 is carried out, until the channel layer 4 is reached. The etch may further proceed, as shown in FIG. 4A, for a portion of the channel layer 4, for example via ALE (atomic-layer etching). The portion of the channel layer 4 removed has a value comprised between 1 and 400 nm, for example 10 nm, along Z.

The trench 19 is thus formed, which extends in depth in the wafer 50, right through the passivation layer 32 and the barrier layer 6, and terminates on the top surface of the channel layer 4, or else in the channel layer 4. Through the trench 19 a region 4' of the channel layer 4 is thus exposed.

Then (FIG. 4B), a step of deposition or growth of the interface layer 21, of gallium nitride (GaN), is carried out at the surface portion 4' of the channel layer 4. More in general, the interface layer is of a semiconductor compound formed by elements belonging to Groups III-V of the Periodic Table, in particular containing nitride. This step is carried out in a CVD, in particular MOCVD, reactor in an environment that has, as precursor, at least one from among trimethyl gallium (TMGa), trimethyl aluminum (TMAl), and ammonia ($NH_3$), and, as gas carrier, nitrogen ($N_2$). The temperature in the growth chamber is comprised between approximately 500° C. and 1000° C., preferably between 600° C. and 900° C., in particular between 700° C. and 850° C. These temperature ranges enable a good quality of the interface layer 21 formed, at the same time, without any damage to the layers of the device already formed.

The reactor is operated in the way described in what follows. The temperature is brought, in an initial step of the growth process, to the desired working value (for example, 775° C.). During the rise in temperature, nitrogen gas ($N_2$) is introduced in the reactor. This step is preferably carried out in the absence of hydrogen in order to preserve the surface 4' (as well as the portions of the barrier layer 6 exposed through the trench 19) from phenomena of desorption or of release of atoms of N and/or Ga and/or Al from the surface by transition from the solid phase to the gaseous phase that would occur in an environment that presents hydrogen at the aforesaid working temperatures.

Together with nitrogen, ammonia ($NH_3$) is optionally introduced into the reaction chamber, in a ratio with nitrogen such as $1<N_2/NH_3<10$, preferably $3<N_2/NH_3<7$, for example $N_2/NH_3=5$.

A precursor containing gallium (Ga), for example TMGa, is introduced into the reaction chamber when the desired working temperature is reached. The flowrate of introduction of the gallium precursor is chosen lower than 100 μmol/min, preferably lower than 75 μmol/min, in particular between 35 and 65 μmol/min. The ratio between $NH_3$ and the precursor containing gallium, known as V/III ratio, is chosen in the range $2000<V/III<8000$, in particular in the range $4000<V/III<6000$, for example $V/III=5000$.

The growth of the interface layer 21 is carried out according to the protocol provided above until a layer is obtained having a thickness of less than 10 nm, preferably less than 5 nm, for example between 1 and 3 nm.

Then (FIG. 4C), formed, for instance by deposition, is the gate dielectric layer 18a, made for example of a material chosen from among aluminum nitride (AlN), silicon nitride (SiN), aluminum oxide ($Al_2O_3$), and silicon oxide ($SiO_2$). The gate dielectric layer 18a has a thickness chosen between 1 and 50 nm, for example 20 nm. Next (FIG. 4D), a step of deposition of conductive material on the wafer 50 is carried out to form a conductive layer 48 on the gate dielectric layer 18a, in particular filling the trench 19 completely. For instance, the conductive layer 48 is of metal material, such as tantalum (Ta), tantalum nitride (TaN), titanium nitride (TiN), palladium (Pd), tungsten (W), tungsten silicide ($WSi_2$), titanium aluminum (Ti/Al), and nickel gold (Ni/Au), etc.

The conductive layer 48 is then selectively removed with steps lithographic and etching in themselves known for eliminating the conductive layer 48 from the wafer 50 except for the portion thereof that extends in the trench 19 to form the gate metallization 18b. The gate metallization 18b and the gate dielectric 18a form, as a whole, the recessed gate region 18 of the HEMT device of FIG. 2.

Figure 4E:
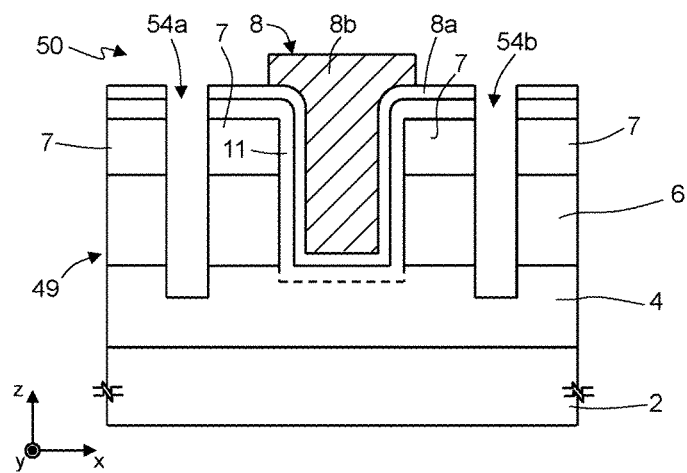

Then (FIG. 4E), one or more further steps of masked etching of the dielectric layer 18a, of the interface layer 21, of the passivation layer 32, of the barrier layer 6, and of the channel layer 4 are carried out to remove selective portions thereof that extend in regions of the wafer 50 where the source and gate regions 10, 12 of the HEMT device 1' are to be formed. Removal of portions of the passivation layer 32 leads to formation of the insulation layer 7 as illustrated in FIG. 2.

In particular, openings 54a and 54b are formed on opposite sides, along X, of the gate region 18, and at a distance from the gate region 18.

Figure 4F:
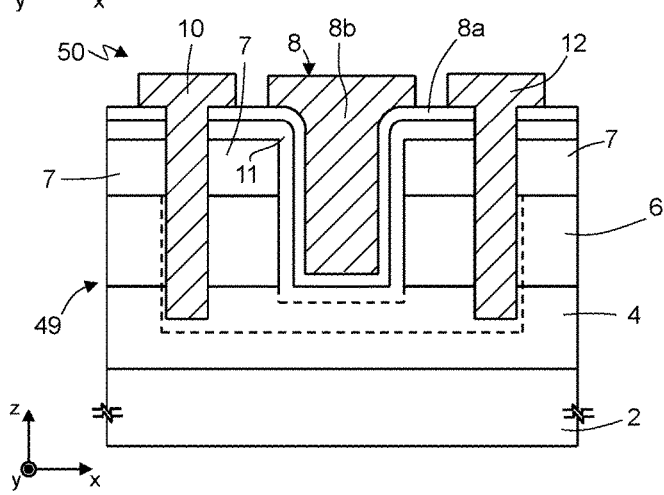

Then (FIG. 4F), a step of formation of ohmic contacts is carried out to obtain the source and drain regions 10, 12, by depositing conductive material, in particular metal such as titanium (Ti) or aluminum (Al), or alloys or compounds thereof, by sputtering or evaporation, on the wafer 50 and in particular inside the openings 54a, 54b. Then a subsequent step of etching of the layer of metal thus deposited is carried out to remove said metal layer from the wafer 50 except for the metal portions to extend within the openings 54a and 54b, to form in said openings 54a and 54b the source region 10 and drain region 12, respectively.

The HEMT device 1' shown in FIG. 2 is thus formed.

With reference again to the HEMT device 1 according to the embodiment of FIGS. 3A-3G, it envisages, according to one aspect of the present disclosure, formation of the interface layer 11 prior to the step of formation of the gate region 8. The interface layer 11 is, in particular, of the same material as the one used for the barrier layer 6. However, this condition is not necessary in so far as it is sufficient for the interface layer 11 to be made of a compound based upon ternary or quaternary alloys of gallium nitride, such as for example $Al_xGa_{1-x}N$, AlInGaN, and $In_xGa_{1-x}N$. Formation of the interface layer 11 makes it possible to eliminate, or at least reduce, the problems linked to the interface imperfections present in the known art and generated by the etching step for formation of the gate trench. In fact, the growth of the interface layer 11 eliminates the defectiveness caused by the previous etching (for example, by filling possible empty spaces or recesses), and thus eliminates the causes of trapping of charge carriers.

Similar advantages may be achieved with the HEMT device 1' obtained according to the steps of FIGS. 4A-4F.

Consequently, according to the present disclosure, the operating and functional characteristics (in particular $V_{TH}$ and/or $R_{ON}$) of the HEMT device 1, 1' are improved as compared to what is available according to the known art.

Figure 5:
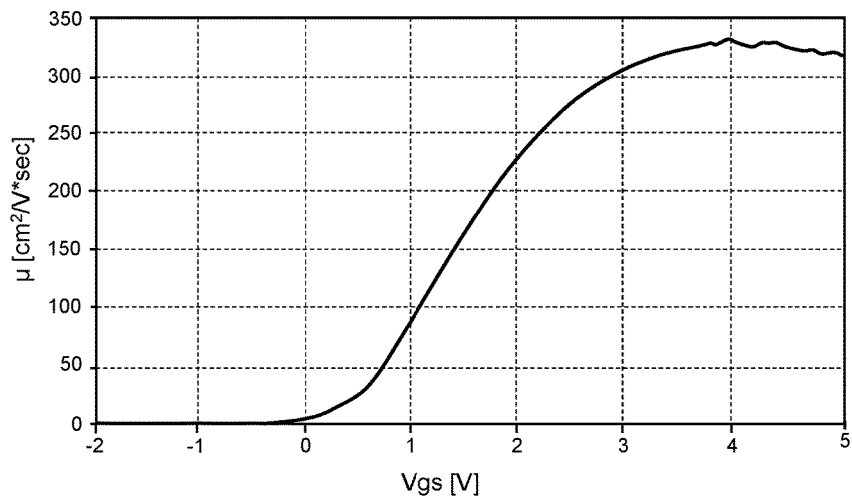
FIG. 5 shows the plot of the electron mobility in the HEMT of FIG. 2.

A HEMT device provided according to the present disclosure shows high values of electron mobility, close to 350 cm²/Vs, as shown in FIG. 5.

Furthermore, according to the present disclosure, there are no constraints of thickness for the barrier region 6, nor constraints regarding the concentration of aluminum in the barrier layer 6, in order to modulate the value of threshold voltage $V_{TH}$ and/or ON-state resistance $R_{ON}$, as is instead the case of the known art. Consequently, the barrier layer 6 may be chosen of the desired thickness to optimize general operation of the HEMT device, as likewise the corresponding concentration of aluminum.

Finally, the manufacturing method according to the present disclosure makes it possible to provide heterostructures via epitaxial growth with high flexibility of design, without in any way limiting the choice of the best methodology of growth of layers of AlGaN and GaN (or its alloys) and the corresponding thicknesses.

Finally, it is clear that modifications and variations may be made to what is described and illustrated herein, without thereby departing from the scope of the present disclosure.

For instance, at the interface between the substrate 2 and the channel layer 4 a further one or more transition layers (not shown) of gallium nitride and compounds thereof, such as AlGaN, or AlN, may be present having the function of interface for reducing the lattice misalignment between the substrate 2 and the channel layer 4.

Furthermore, the active region 3a comprises, as has been said, one or more layers of GaN, or GaN alloys, which constitute the active part of the device, with a thickness, barrier concentration, and type of alloy (for example, GaN and/or $Al_xGa_yN$) chosen appropriately according to the device to be obtained (for example, but not only, HEMTs, Schottky diodes, MESFETs, etc.).

The metallizations of the source and drain contacts may further be provided on the front of the wafer in ohmic contact with the top face 6a of the layer 6, or partially recessed within the single layer 6.

The metallizations of the source, drain, and gate contacts may be made using any material suitable for the purpose, such as formation of contacts of AlSiCu/Ti, Al/Ti, or W-plugs, or others still.

Figure 6:
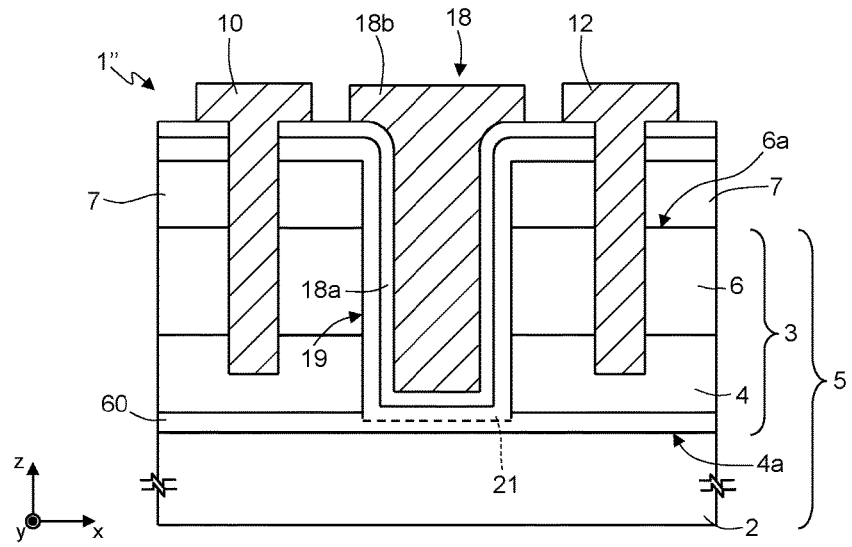
FIG. 6 shows an HEMT of a normally off type, according to a further embodiment of the present disclosure.

According to a further variant of the present disclosure, shown in FIG. 6, a HEMT device 1" is obtained in a way similar to what has already been described with reference to FIGS. 4A-4F, and further comprises a buffer layer 60, of aluminum and gallium nitride (AlGaN) or of gallium and indium nitride (InGaN), which extends between the substrate 2 and the channel layer 4. In this case, the semiconductor body 5 further comprises the buffer layer 60. This buffer layer 60 enables a better depletion of the two-dimensional electron gas (2DEG) in the conductive channel at the gate region. If the buffer layer is present, the recessed gate region 18 according to the embodiment of FIG. 2, may extend right through the channel layer 4 and terminate at the interface between the channel layer 4 and the underlying buffer layer 60 (in a way not shown in the figure), or else terminate within the underlying buffer layer 60 (as illustrated in FIG. 6).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor, comprising:
   a semiconductor body;
   a first dielectric layer on the semiconductor body;
   an opening extending through the first dielectric layer, the opening having sidewalls and a bottom surface;
   an interface layer on the sidewalls of the opening;
   a second dielectric layer formed on the interface layer;
   a gate electrode positioned at least partially in the opening and on the second dielectric layer;
   a source contact having a first portion and a second portion, the first portion of the source contact extending through the first dielectric layer and into the semiconductor body in a first direction, the second portion of the source contact extending on the second dielectric layer in a second direction that is transverse to the first direction; and
   a drain contact having a first portion and a second portion, the first portion of the drain contact extending through the first dielectric layer and into the semiconductor body in the first direction, the second portion of the drain contact extending on the second dielectric layer in the second direction.

2. The transistor of claim 1, wherein the semiconductor body includes at least a first semiconductor layer and a second semiconductor layer.

3. The transistor of claim 2, wherein the source contact and the drain contact extend through the second semiconductor layer and into the first semiconductor layer.

4. The transistor of claim 1, wherein the gate electrode extends to a first depth, and the source contact and the drain contact extend to a second depth that is greater than the first depth.

5. The transistor of claim 1, wherein the gate electrode extends to a first depth, and the source contact and the drain contact extend to a second depth that is less than the first depth.

6. The transistor of claim 1, wherein the gate electrode has a first portion and a second portion, the first portion of the gate electrode extending in the first direction, the second portion of the drain contact extending on the second dielectric layer in the second direction.

7. A transistor, comprising:
   a first semiconductor layer;
   a second semiconductor layer on the first semiconductor layer;
   a first opening extending in a first direction into the second semiconductor layer, the first opening having sidewalls and a bottom surface;
   an interface layer on the sidewalls of the first opening;
   a first dielectric layer formed on the interface layer;
   a gate electrode positioned at least partially in the first opening and on the first dielectric layer;
   a second opening extending in the first direction through the interface layer and the first dielectric layer;
   a source contact having a first portion and a second portion, the first portion being positioned at least partially in the second opening and extending in the first direction, the second portion extending on the first dielectric layer in a second direction that is transverse to the first direction;
   a third opening extending in the first direction through the interface layer and the first dielectric layer; and a drain contact having a first portion and a second portion, the first portion being positioned at least partially in the third opening and extending in the first direction, the second portion extending on the first dielectric layer in the second direction.

8. The transistor of claim 7, wherein the gate electrode extends to a first depth, and the source contact and the drain contact extend to a second depth that is greater than the first depth.

9. The transistor of claim 7, wherein the interface layer is of a III-V semiconductor material.

10. The transistor of claim 7, wherein the source contact is spaced apart from a first side of the gate electrode and the drain contact is spaced apart from a second side of the gate electrode.

11. The transistor of claim 7, wherein the source contact and the drain contact abut the first dielectric layer.

12. The transistor of claim 7, wherein the source contact and the drain contact abut the interface layer.

13. The transistor of claim 7, further comprising a second dielectric layer between the second semiconductor layer and the interface layer.

14. A transistor, comprising:
a first semiconductor layer;
a second semiconductor layer on the first semiconductor layer;
a first dielectric layer on the second semiconductor layer;
a first opening extending in a first direction into the first semiconductor layer through the first dielectric layer and the second semiconductor layer, the first opening having sidewalls and a bottom surface;
an interface layer on the sidewalls of the first opening;
a second dielectric layer formed on the interface layer;
a gate electrode positioned at least partially in the first opening and on the second dielectric layer;
a second opening extending in the first direction through the interface layer and the second dielectric layer;
a source contact having a first portion and a second portion the first portion being positioned at least partially in the second opening and extending in the first direction, the second portion extending on the second dielectric layer in a second direction that is transverse to the first direction;
a third opening extending in the first direction through the interface layer and the second dielectric layer; and
a drain contact having a first portion and a second portion, the first portion positioned at least partially in the third opening and extending in the first direction, the second portion extending on the second dielectric layer in the second direction.

15. The transistor of claim 14, wherein the gate electrode extends to a first depth, and the source contact and the drain contact extend to a second depth that is greater than the first depth.

16. The transistor of claim 14, wherein the gate electrode extends to a first depth, and the source contact and the drain contact extend to a second depth that is less than the first depth.

17. The transistor of claim 14, wherein the first opening extends through the first semiconductor layer.

18. The transistor of claim 14, wherein the gate electrode has a first portion and a second portion, the first portion of the gate electrode extending in the first direction in the opening, the second portion of the gate electrode extending on the second dielectric layer in a second direction that is transverse to the first direction.

19. The transistor of claim 14, further comprising:
a substrate; and
a third semiconductor layer arranged between the substrate and the first semiconductor layer, wherein the opening extends into the third semiconductor layer.

* * * * *